US010670221B2

(12) United States Patent
Mornet et al.

(10) Patent No.: US 10,670,221 B2
(45) Date of Patent: Jun. 2, 2020

(54) SEMICONDUCTOR-COMPONENT DEVICE ASSEMBLED ON A HEAT SINK, ASSEMBLY METHOD, AND LIGHTING DEVICE FOR A MOTOR VEHICLE INCLUDING SUCH A DEVICE

(71) Applicant: Valeo Vision, Bobigny (FR)

(72) Inventors: Eric Mornet, Nogent sur Marne (FR); Bruno Ducloux, Sens (FR); Nadia Yacoubi, Bobigny (FR); Remi Letoumelin, Chessy (FR); Jean-Claude Puente, Livry Gargan (FR); Franck Matte, Vaureal (FR); Didier Jacquemin, Longeville sur Mogne (FR)

(73) Assignee: Valeo Vision, Bobigny (FR)

( * ) Notice: Subject to any disclaimer, the term of this patent is extended or adjusted under 35 U.S.C. 154(b) by 369 days.

(21) Appl. No.: 14/868,922

(22) Filed: Sep. 29, 2015

(65) Prior Publication Data

US 2016/0091164 A1 Mar. 31, 2016

(30) Foreign Application Priority Data

Sep. 30, 2014 (FR) ...................................... 14 59309

(51) Int. Cl.
*B60Q 1/00* (2006.01)
*F21S 45/47* (2018.01)
(Continued)

(52) U.S. Cl.
CPC ............. *F21S 45/47* (2018.01); *B60Q 1/0088* (2013.01); *F21S 43/14* (2018.01); *F21S 43/19* (2018.01);
(Continued)

(58) Field of Classification Search
CPC .................................................. F21S 48/328; F21S 43/195; B26J 6/00; B26J 6/04; B26J 6/18; B26J 6/001
(Continued)

(56) References Cited

U.S. PATENT DOCUMENTS 5,735,041 A * 4/1998 Zaguskin ............ B60R 16/0207
29/857
6,302,568 B1 * 10/2001 Ohtaki ................... B60Q 1/007
362/546
(Continued)

FOREIGN PATENT DOCUMENTS

DE 202004003793 U1 * 5/2004 ............ F21S 48/328
EP 2177398 4/2010
(Continued)

OTHER PUBLICATIONS

Screenshot of Amazon, Uxcell product, "Uxcell R design nylon cable clamp wire organizer", https://www.amazon.com/uxcell%C2% AE-Design-Nylon-Cable-Organizer/dp/B0076V3H9W; published before May 22, 2014.*

*Primary Examiner* — Matthew J. Peerce
(74) *Attorney, Agent, or Firm* — Oblon, McClelland, Maier & Neustadt, L.L.P.

(57) ABSTRACT

A device including at least one semiconductor component connected to an electrical connection element, the electrical connection element is attached to a heat sink and connected to a group of electrical wires, the group being linked mechanically and electrically to the electrical connection element by a single connector, the group being linked to the heat sink by holding means.

18 Claims, 8 Drawing Sheets

(51) Int. Cl.
  *F21S 45/00* (2018.01)
  *F21S 43/14* (2018.01)
  *F21S 43/19* (2018.01)
  *H05K 1/11* (2006.01)
  *H05K 1/18* (2006.01)
  *H05K 3/30* (2006.01)
  *H05K 3/32* (2006.01)
  *H05K 7/20* (2006.01)

(52) U.S. Cl.
  CPC ............. *F21S 45/00* (2018.01); *H05K 1/11* (2013.01); *H05K 1/181* (2013.01); *H05K 3/303* (2013.01); *H05K 3/32* (2013.01); *H05K 7/20409* (2013.01)

(58) Field of Classification Search
  USPC .......................................................... 362/547
  See application file for complete search history.

(56) References Cited

U.S. PATENT DOCUMENTS

| | | | |
|---|---|---|---|
| 7,665,872 B2* | 2/2010 | Nakabayashi | F21S 48/1104 362/519 |
| 7,798,690 B2 | 9/2010 | Watanabe et al. | |
| 8,277,093 B2* | 10/2012 | Mochizuki | F21V 21/002 362/218 |
| 9,174,689 B2 | 11/2015 | Owada | |
| 2005/0225939 A1* | 10/2005 | Otsuki | H01L 23/467 361/695 |
| 2007/0025117 A1 | 2/2007 | Watanabe et al. | |
| 2012/0201043 A1* | 8/2012 | DiPenti | F21S 48/1104 362/545 |
| 2014/0313762 A1 | 10/2014 | Owada | |
| 2015/0003026 A1* | 1/2015 | Lin | F21V 27/00 361/752 |

FOREIGN PATENT DOCUMENTS

| | | |
|---|---|---|
| FR | 2889290 A1 | 2/2007 |
| JP | 2014164876 A | 9/2014 |

* cited by examiner

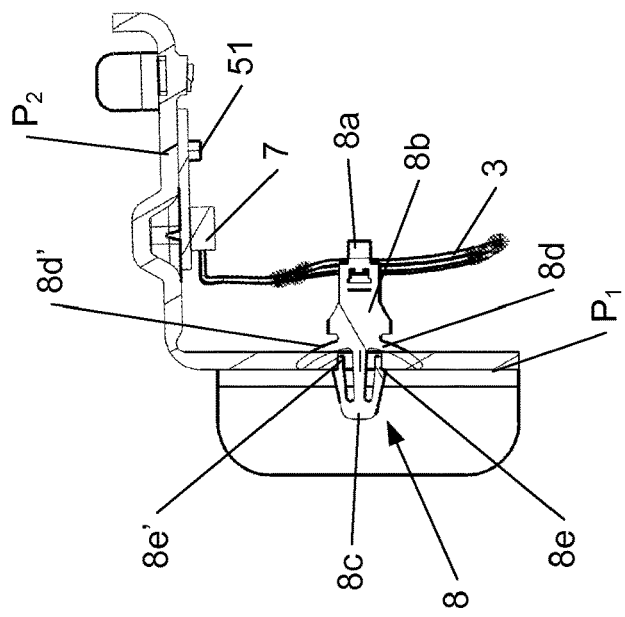
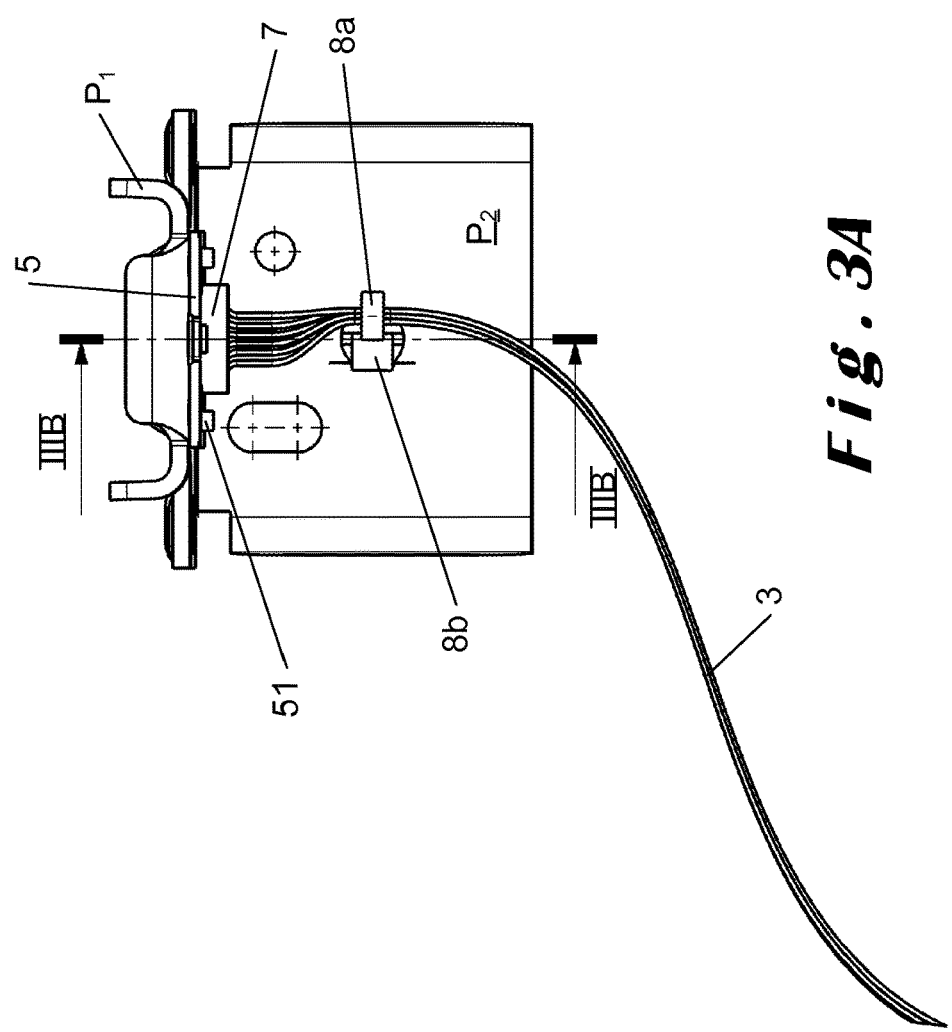

SEMICONDUCTOR-COMPONENT DEVICE ASSEMBLED ON A HEAT SINK, ASSEMBLY METHOD, AND LIGHTING DEVICE FOR A MOTOR VEHICLE INCLUDING SUCH A DEVICE

CROSS-REFERENCE TO RELATED APPLICATIONS

This application claims priority to the French application 1459309 filed on Sep. 30, 2014, which application is incorporated herein by reference and made a part hereof.

BACKGROUND OF THE INVENTION

1. Field of the Invention

The invention relates to a semiconductor-component device assembled on a heat sink, the semiconductor component being connected to an electrical connection element.

The invention also relates to a method for assembling the aforementioned device, and to a lighting device for a motor vehicle incorporating such a device.

The present invention is specifically intended for use in the assembly of a light source in a motor vehicle lamp.

2. Description of the Related Art

In the domain of motor vehicle lighting, when using light-emitting diodes (LEDs, which are semiconductor components) as a light source, it is known to assemble these LEDs on an electrical connection element, for example a printed circuit board (PCB) to provide the electrical connection between the components assembled thereupon, and to subsequently position the LED/PCB assembly so obtained on a heat sink (typically a cooling rib). This heat sink, which is intended to cool the LED when in operation (and to act as a lamp cooling rib) is subsequently assembled in the lamp on a supporting element, such as a reflector of the lamp.

In particular, soldering the components onto the printed circuit board requires a method involving the application of soldering paste, the positioning of the components, and passing through a reflow oven, in which the soldering paste melts and then solidifies to attach the electronic components. These electronic components may include for example one or more LEDs, a connector, capacitors and resistors. Moreover, in order to ensure the electrical connection of the components to the rest of the vehicle, a first portion of the connector (female portion) is also welded to the board. The assembled board is then placed on the heat sink, which is subsequently placed on the supporting element of the lamp.

Once the heat sink has been placed on the related supporting element, the printed circuit board is connected electrically to the remainder of the vehicle by joining a second portion of the connector (male portion) to the first portion, the second connector portion being linked electrically to a group of electrical wires intended to operate the link.

Consequently, the placement of the heat sink on the supporting element is not hindered by the presence of floating electrical wires that could hinder the rapid assembly since these electrical wires are free to move and occupy the connection spaces formed between the heat sink and the supporting element.

However, although the method known from the prior art saves the operator assembling the semiconductor component from having to perform an additional electrical wire management step when positioning the heat sink on the related supporting element, this method presents a greater problem: it is costly in that, firstly, the choice of materials used to manufacture the first connector portion is determined by the installation requirements of the printed circuit board, i.e. high temperatures (within a range of approximately 200-300° C.), which the first connection portion must be able to withstand. These temperatures are the temperatures found during the soldering step of the first connection portion assembled on the printed circuit board. Secondly, the assembly method as known from the prior art is particularly lengthy since, once the heat sink has been positioned on the related lighting supporting element, it is then necessary to connect the second connector portion, linked to the group of electrical wires, to the first connector portion on the printed circuit board, which is done in a confined and therefore relatively inaccessible space formed between the supporting element and the heat sink, which may be difficult. This difficulty is further exacerbated by the presence of floating electrical wires which hinder the visibility of the operator when connecting the two connector portions, and which are also likely to come between the mechanical elements to be assembled, during this step of the method or during a subsequent step.

Subsequently, the method known from the prior art requires additional operations after connection of the two connector portions, which involve carrying out tests using dedicated hardware to check that the connection between the two connector portions has been made correctly.

The duration of the method known from the prior art undoubtedly results in a loss of profitability since it involves implementing such a method on a large scale (i.e. on a series of lamps on a production line).

SUMMARY OF THE INVENTION

The invention is intended to overcome the drawbacks in the prior art by providing an assembly method for a lighting device that is less costly while ensuring satisfactory reliability and easy—and therefore rapid—assembly of the different elements of the lighting device.

To overcome this problem, the invention proposes a device including at least one semiconductor component connected to an electrical connection element, the electrical connection element is attached to a heat sink and connected to a group of electrical wires, the group being linked mechanically and electrically to the electrical connection element by a single connector, the group being linked to the heat sink by holding means.

The invention also relates to a method for assembling a semiconductor component on a heat sink, the semiconductor component being connected to an electrical connection element, the method comprising:

a first step in which a group of electrical wires is attached and connected to the electrical connection element, a second step in which the group is attached to the heat sink, and a third step in which the electrical connection element is attached to the heat sink.

Consequently, in relation to the specific application of the invention, which relates to the assembly of a light source in a motor vehicle lamp, the operator can then attach the group to the electrical connection element (for example a printed circuit board), attach the group to the heat sink, attach the printed circuit board to the heat sink, before placing the heat sink on the supporting element of the lamp in order, firstly, to obviate the need for the operator to handle the group when attaching the board and the heat sink and, secondly, to prevent the free movement of the group when assembling the lighting device.

Thus, the assembly of a semiconductor component on a heat sink according to the invention results not only in reduced assembly time since the operator can first easily connect the group to the printed circuit board before attaching and guiding the group into a non-restrictive position when assembling the board and the heat sink, but also in reduced manufacturing costs for the printed circuit board since it is no longer necessary to have a first connection portion positioned on the card and arranged to be connected to a second connection portion linked to the group of electrical wires.

Indeed, the invention enables the operator to use a single one-piece connector which can be attached to the printed circuit board. This connector is inserted into the metallized holes in the printed circuit board, to be attached by the selective wave soldering. The housing of the connector undergoes temperatures well below the temperatures of between 200° C. and 300° C. that are used in a conventional reflow oven.

Consequently, this single connector no longer has to be made from a material specifically designed to withstand the high temperatures found in a conventional reflow oven.

Additionally, the step in which the group of electrical wires is attached to the heat sink prevents, in operation, any wear of the group by friction against the surface or edges of the heat sink or of the supporting element since the group is no longer free to move under the effect of vibrations caused by operation of the motor vehicle, since it is held in a predetermined position.

According to different embodiments of the device according to the invention, which may be taken together or separately:
- the semiconductor component comprises at least one semi-conductive emitter chip, preferably a light-emitting diode,
- the heat sink is linked to a motor vehicle lamp supporting element, preferably to a motor vehicle lamp reflector, or inside a vehicle rear-light supporting element,
- the electrical connection element is a printed circuit board,
- the group is linked to the heat sink by holding means including at least a first lug projecting from a surface of the heat sink, the group of electrical wires being held between the lug and the surface,
- the holding means include a second lug projecting from the surface of the heat sink, the group of electrical wires being held between the first and second lugs and the surface,
- the group is linked mechanically to the heat sink by holding means comprising a first portion formed by a clamping ring through which the group passes and a second portion formed by a foot made of a thermally insulating material attaching the clamping ring to the heat sink, the heat sink is substantially L-shaped,
- the holding means are on one of the branches of the L-shape of the heat sink, and
- the heat sink has openings.

According to different embodiments of the method according to the invention, which may be taken together or separately:
- the first step involves attaching and electrically connecting a connector, the connector being linked electrically and mechanically to the group, to the electrical connection element,
- the second step involves positioning the group between at least one first lug projecting from a surface of the heat sink and the surface of the heat sink, such that the group is held between the lug and the surface of the heat sink,
- the second step also involves positioning the group between a second lug projecting from the surface of the heat sink and the surface of the heat sink, such that the group is held between the first and second lugs and the surface of the heat sink,
- the second step involves moving the group through a clamping ring, the ring being extended by a foot made of a thermally insulating material, the ring being attached to the heat sink via the foot,
- the second attachment step of the group is carried out before or after the third step in which the electrical connection element is attached to the heat sink, and
- the method according to the invention also includes a fourth step in which the heat sink is assembled on a supporting element of a motor vehicle lamp.

Finally, the invention relates to a lighting device for a motor vehicle incorporating the device according to the invention.

Other features and advantages of the invention are set out in the non-limiting description given below.

These and other objects and advantages of the invention will be apparent from the following description, the accompanying drawings and the appended claims.

BRIEF DESCRIPTION OF THE ACCOMPANYING DRAWINGS

FIGS. 3A and 3B show the device resulting from the first embodiment of the method according to the present invention.

In these figures, similar elements are indicated using the same reference sign.

DETAILED DESCRIPTION OF THE PREFERRED EMBODIMENTS

The steps for assembling an electronic semiconductor component 1 on a heat sink according to the first embodiment of the method according to the present invention are illustrated in FIGS. 1A to 1E.

Figure 1A:
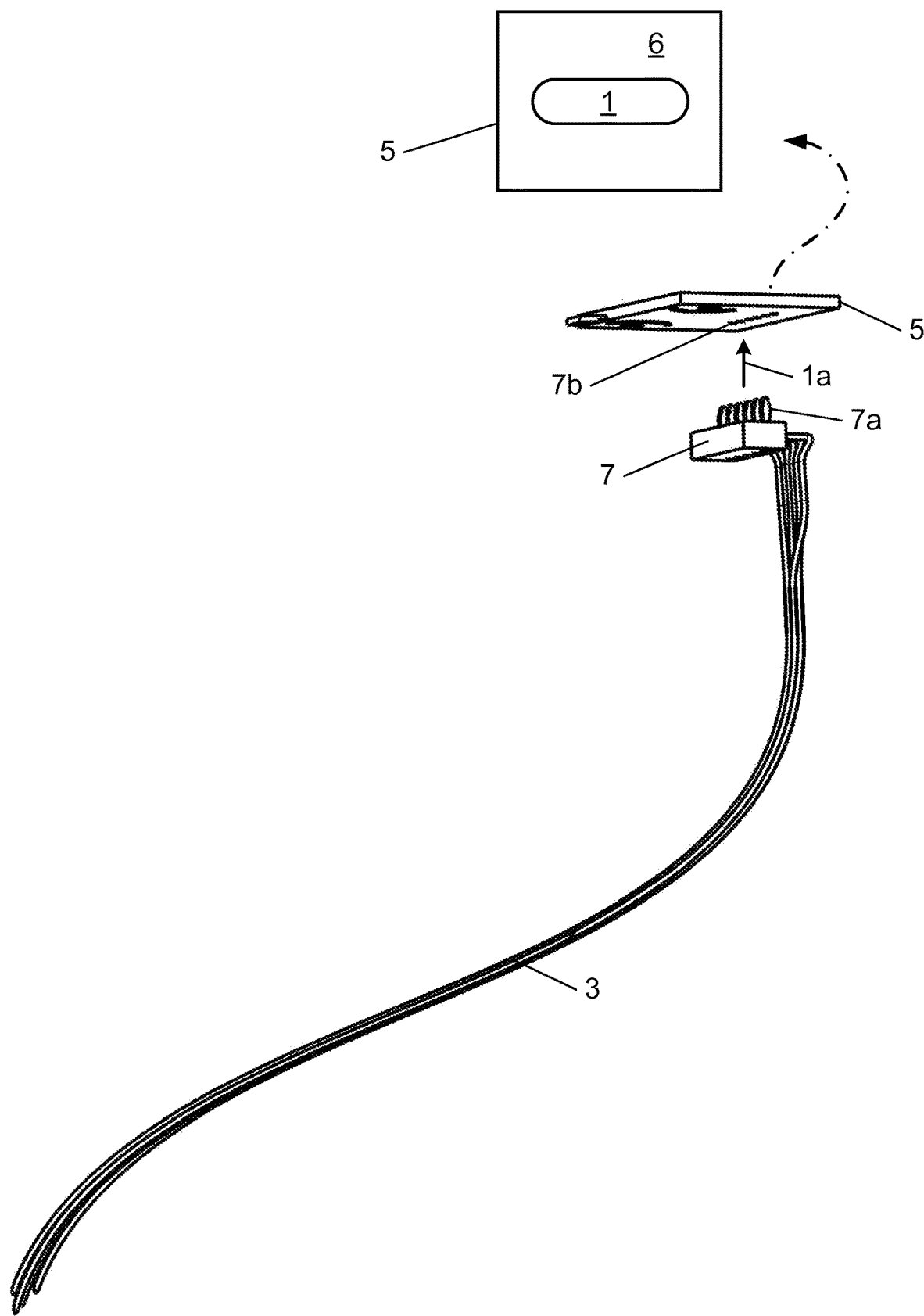
FIGS. 1A to 1E show a first embodiment of the method for assembling a semiconductor component on a heat sink according to the invention.

The assembly method mentioned above includes a first step 1a in which a group 3 of electrical wires is attached to a rear face of an electrical connection element 5, which is a printed circuit board (PCB), the front face 6 of which carries the semiconductor component, for example a light emitting diode (LED) 1 (FIG. 1A). A variant of the embodiment in which the LED 1 is assembled on the PCB 5 involves the LED 1 being assembled directly on the heat sink, then connected to the PCB 5, for example by wire solder.

During this first step 1a, the group 3 of electrical wires is attached to the PCB 5 by means of a one-piece connector 7

(or single connector) linked electrically and mechanically to the group 3 such that the PCB 5 is connected physically and electrically to each of the electrical wires in the group 3.

The connection is made by insertion, from the rear face of the PCB 5, of a plurality of contacts 7a present on the one-piece connector 7 into the metallized connection holes 7b formed in the PCB 5, the connector 7 being then wave soldered directly to the PCB 5.

Figure 1B:
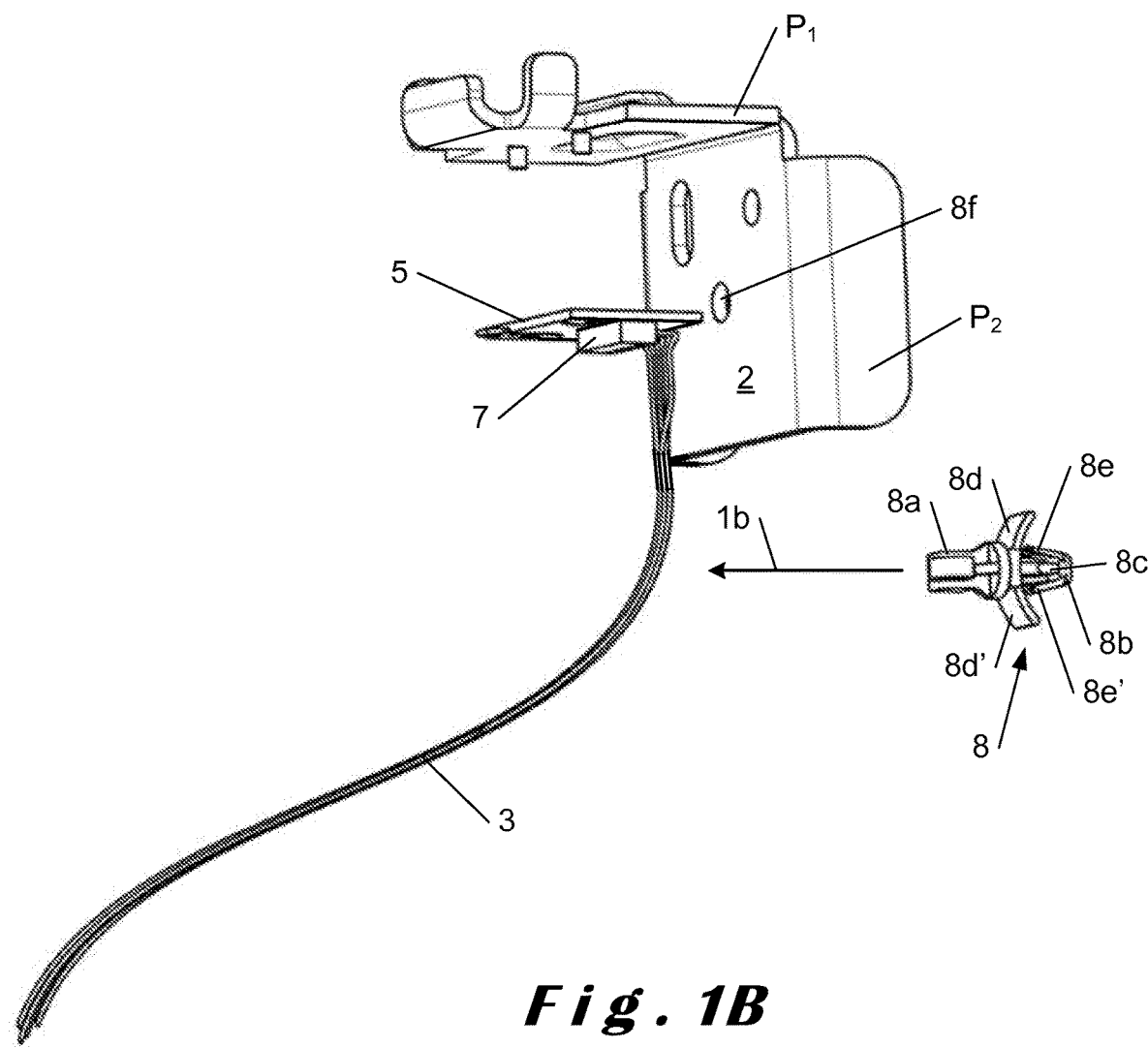
Figure 1C:
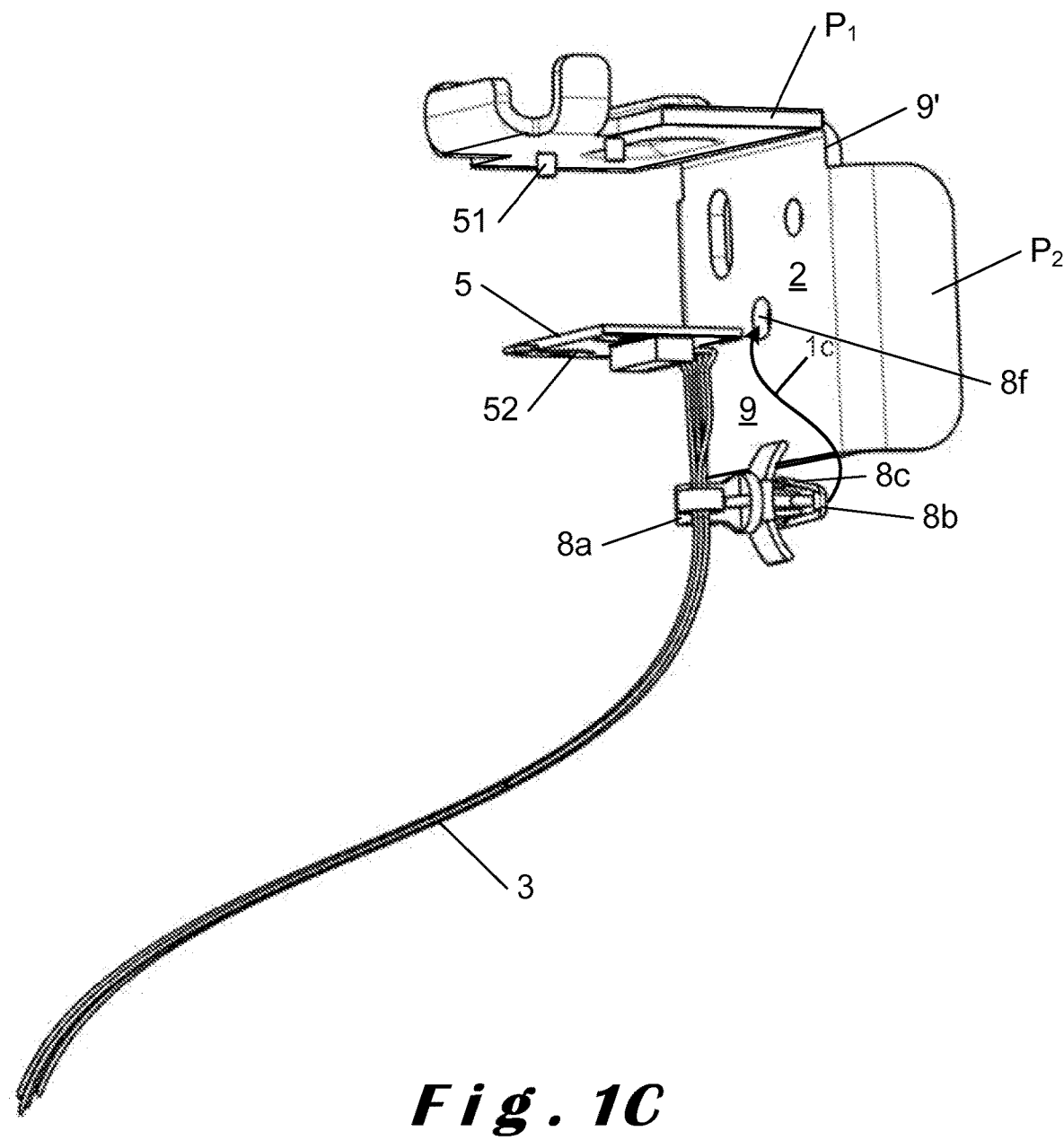
Figure 1D:
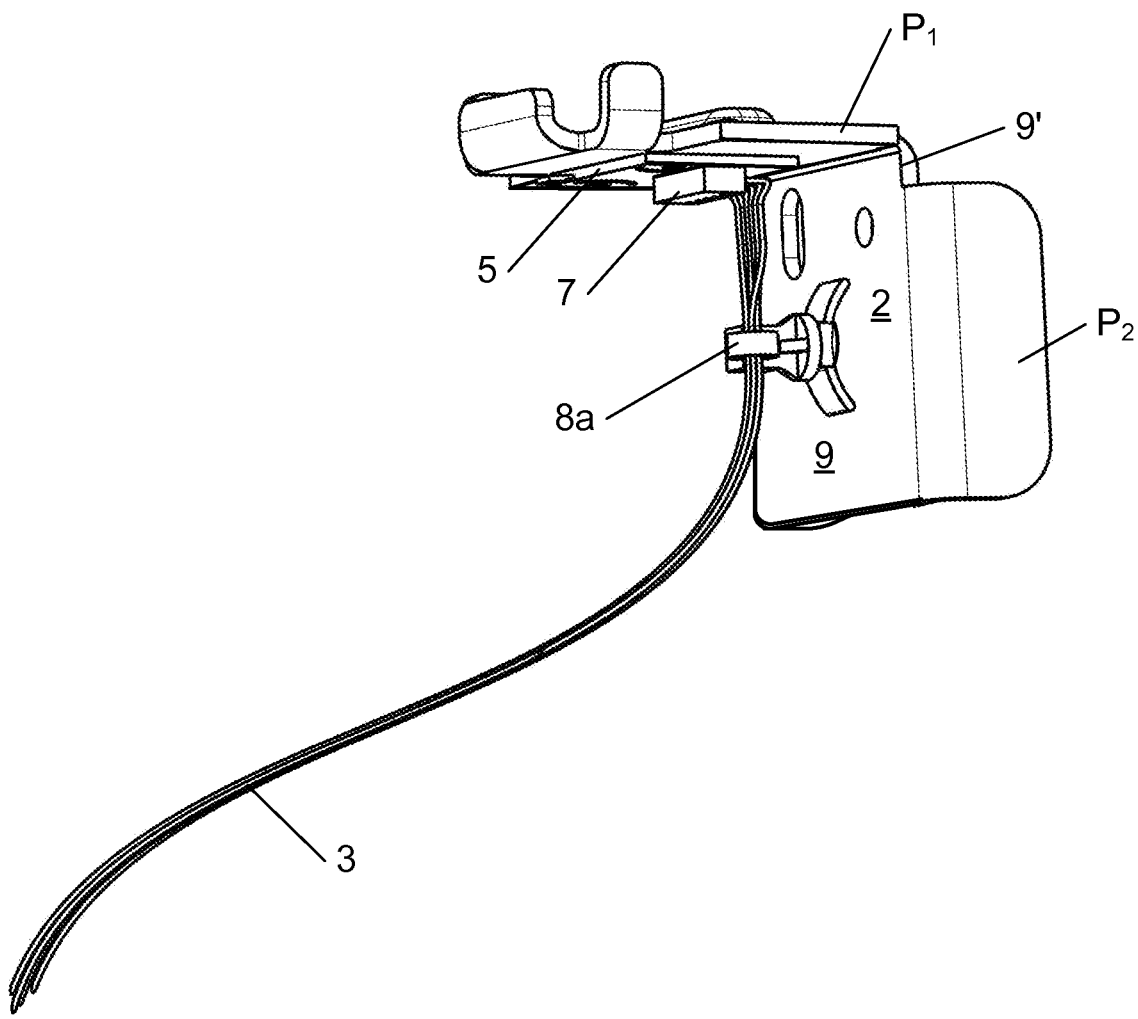

FIG. 1b shows the second step 1b in which the group 3 is attached to the heat sink 2 using means 8 for holding the group 3.

The heat sink 2 is formed by a first portion $P_1$ and a second portion $P_2$ linked together directly and for example in a substantially L-shape, i.e. oriented such that a first plane tangential to the first portion $P_1$ and a second plane tangential to the second portion $P_2$ form a substantially right angle.

Preferably, the heat sink 2 has openings to enable the circulation of air.

In the first embodiment of the method according to the invention, the second step 1b involves moving the group 3 through a first portion of the holding means 8, which is a clamping ring 8a, the ring 8a being extended by a second portion of the holding means 8, which is a click-fit foot 8b.

The foot 8b has a click-fit branch 8c and two fins 8d, 8d' that bear against the heat sink 2.

The click-fit branch 8c comes from an extremity of the foot 8b to which each of the fins 8d, 8d' are linked and has two elbows 8e, 8e' (or fins) protruding from the click-fit branch 8c in mutually opposing directions such as to form a click-fit arrow comprising the click-fit branch 8c and the two elbows 8e, 8e', this arrow being arranged to be inserted in a first orifice 8f in the heat sink 2, for example in the second portion P2 of same.

Once the group 3 is engaged in the clamping ring 8a, the click-fit branch 8c is inserted (FIG. 1C) in the first orifice 8f such that the elbows 8e, 8e' pass through the first orifice 8f entirely and that, once the click-fit branch 8c has been inserted in the first orifice 8f, the two fins 8d, 8d' bear against a first face 9 of the second portion $P_2$, while the elbows 8e, 8e' bear against a second face 9' of the second portion $P_2$ opposite the first face 9. Consequently, the foot 8b is held against each of the first and second faces 9, 9' of the second portion $P_2$ of the heat sink 2, thereby linking the ring 8a to the heat sink 2.

Preferably, the click-fit branch 8c and the two elbows 8e, 8e' form a single arrow-shaped attachment part made of a flexible material, such that this attachment part can be easily inserted into the first orifice 8f by simply pressing same, the connection part, and in particular the elbows 8e, 8e' being deformable as they pass through the first orifice 8f before subsequently returning to the original arrow shape, such that the elbows 8e, 8e' can bear against the second face 9' of the second portion $P_2$ of the heat sink 2.

Preferably, the foot 8b is made of a thermally insulating material such that the group 3 is thermally decoupled from the heat sink 2 when the LED 6 is in operation and the heat sink 2 is being heated.

Once the group 3 has been attached to the heat sink 2, the PCB 5 is attached, during a third step 1c (FIG. 1C) to the first portion $P_1$ of the heat sink 2.

The PCB 5 (FIG. 1C) is attached by any known means, for example by crimping at least one substantially cylindrical pin 51 protruding from the first portion $P_1$ of the heat sink 2 and arranged to be inserted into a second orifice 52 (or a cavity) made in the PCB 5 designed to tightly fit the pin 51, which is then crushed to fill the orifice 52 such as to irreversibly connect the PCB 5 to the first portion $P_1$ of the heat sink 2.

Preferably, the PCB 5 is in thermal contact with the heat sink 2 to enable same to control the temperature of the heat sink 2 and to modulate the intensity of the electrical current passing through the LED 1 in order to guarantee the reliability of same by preventing the minimum junction temperature of same from being exceeded. The temperature can be controlled using a thermistor connected to the LED 1 and to the PCB 5.

Preferably, steps 1a to 1c of the first embodiment of the claimed method are carried out consecutively, although this is not obligatory.

Advantageously, the second step 1b of attaching the group 3 is carried out before or after the third step 1c of attaching the PCB 5.

Figure 1E:
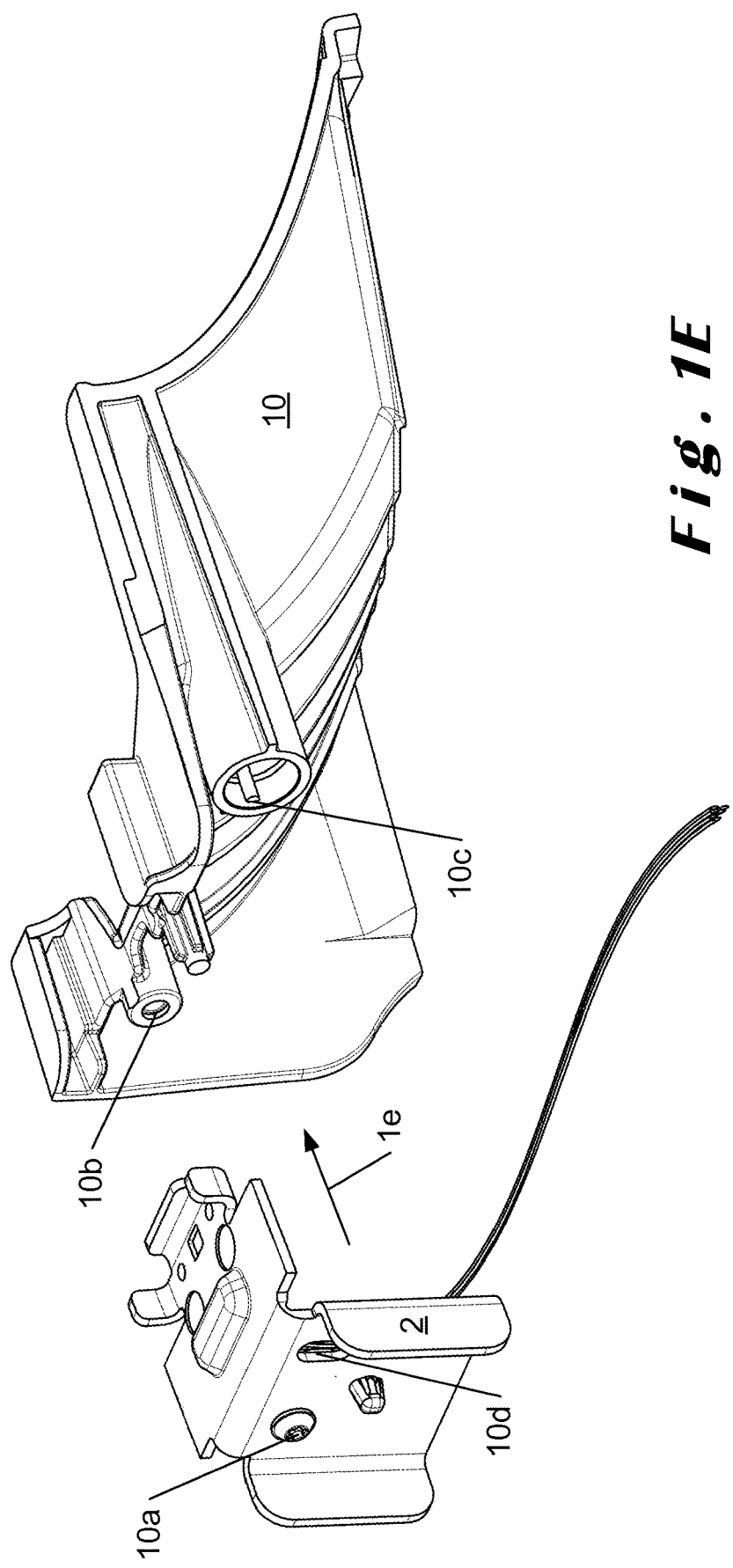

Since the group 3 and the PCB 5 are attached to the heat sink 2 to form a device forming a heat sink 2/group 3/PCB 5 assembly, as shown in FIGS. 3A and 3B, this assembly can then be assembled, during a fourth step 1e illustrated in FIG. 1E, on a supporting element 10 of a motor vehicle lamp.

In a variant embodiment, the assembly can also be assembled on a lamp supporting element before it is assembled on a rear light supporting element of the vehicle.

As shown in FIGS. 3A and 3B, performance of steps 1a to 1c results in a first device comprising an LED 1 carried by the PCB 5 to which the LED 1 is electrically connected. The PCB 5 is attached to the first portion $P_1$ of the heat sink 2 and connected to the group 3 of electrical wires by the one-piece connector 7. The group 3 is attached to the second portion $P_2$ of the heat sink 2 using the holding means 8 comprising the clamping ring 8a through which the group 3 passes and the foot 8b attaching the clamping ring 8a to the heat sink 2.

Figure 4B:
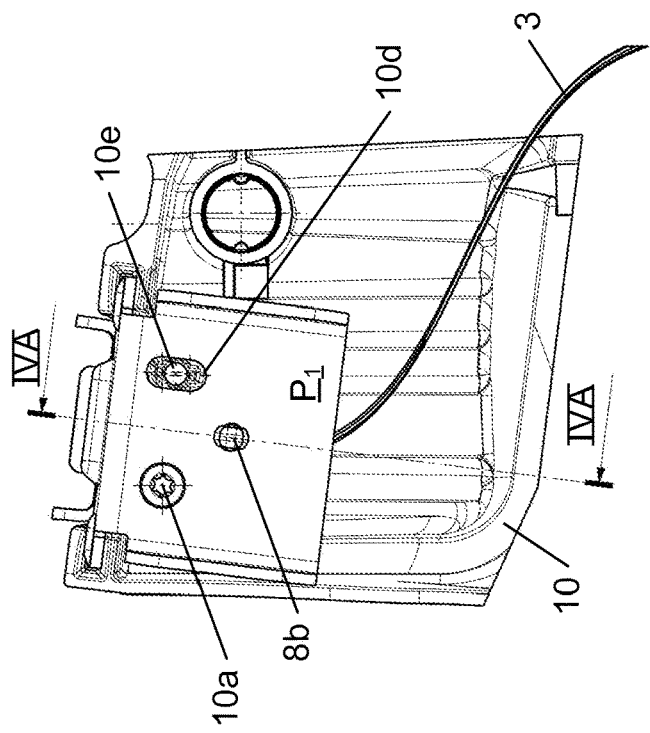
FIGS. 4A and 4B show the device according to FIGS. 3A and 3B in a lamp.
Figure 4A:
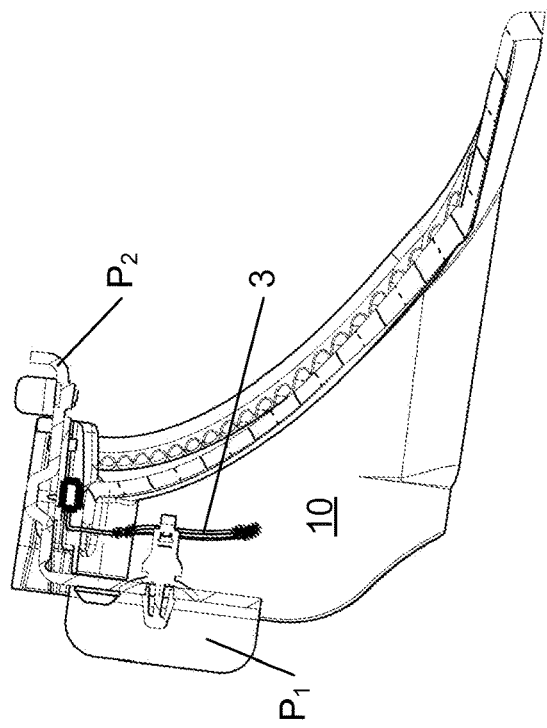

The fourth step 1e for assembling the heat sink 2 on a supporting element 10 of a motor vehicle lamp is shown in FIGS. 4A and 4B. It is done by linking for example the first portion $P_1$ of the heat sink 2 to the supporting element 10 using connection means comprising for example:
  a screw 10a arranged to pass through a third orifice present in the first portion $P_1$ and to be seated in a second cavity 10b of the supporting element 10 having an internal screw thread matching the screw thread of the first screw, and
  a positioning pin 10e of the reflector enabling the cooling rib to be positioned in the direction Y (horizontal axis perpendicular to the movement of the vehicle, the normal referenced used by the operator) through the oblong hole 10d.

As shown in FIGS. 4A and 4B, the fourth step 1e results in a lighting device for a motor vehicle comprising the first device described above connected to the supporting element 10 of the lamp.

When carrying out this fourth step 1e, placement of the heat sink 2 on the supporting element 10 is not hindered by the presence of floating electrical wires and is therefore quicker to complete than the assembly method in the prior art.

Furthermore, in the method according to the invention, the connector, since it is connected to the PCB 5 before attachment of this latter to the heat sink 2, need not be a two-part connector, in particular, as explained above, a one-piece connector is preferred since this choice represents a material saving and, furthermore, this connector no longer needs to be soldered using a soldering method requiring a material specifically designed to withstand high temperatures of between 200° C. and 300° C.

Figure 2A:
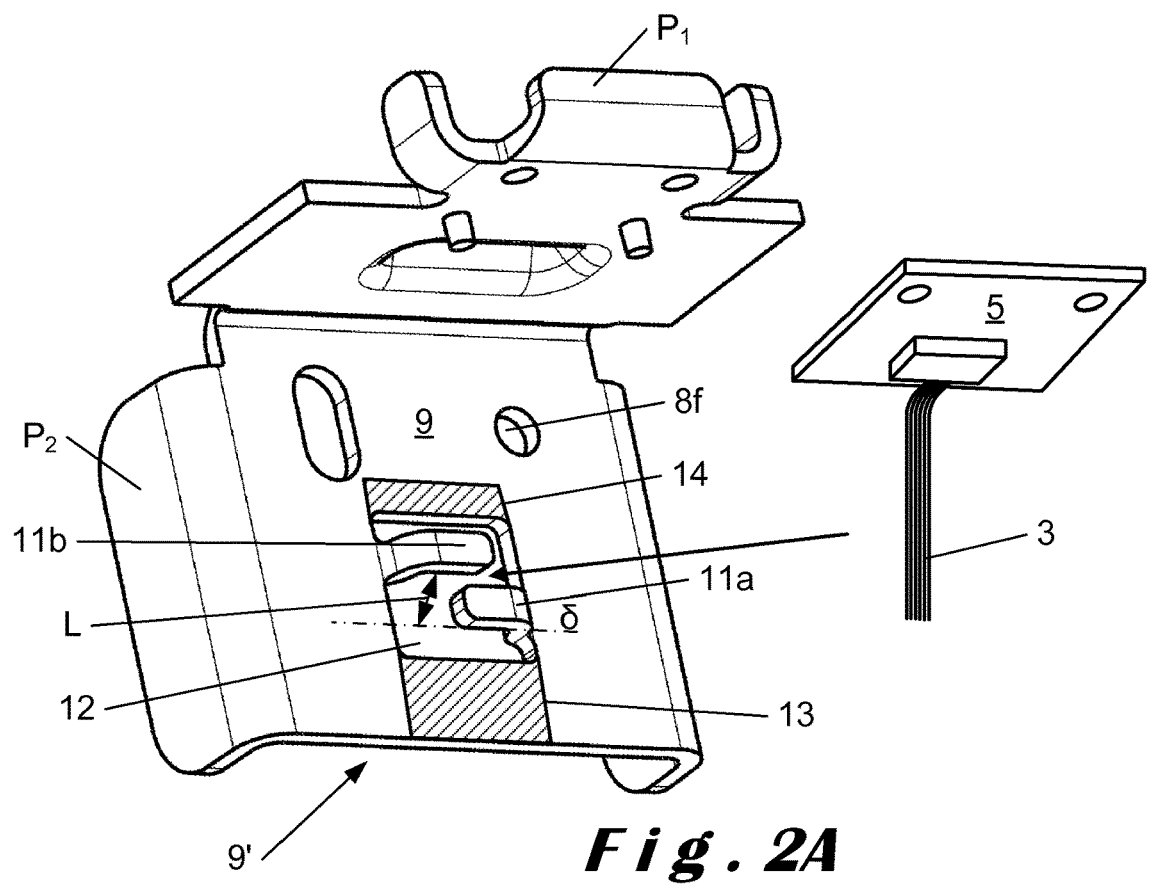
FIGS. 2A and 2B show a second embodiment of the method for assembling a semiconductor component on a heat sink according to the invention.
Figure 2B:
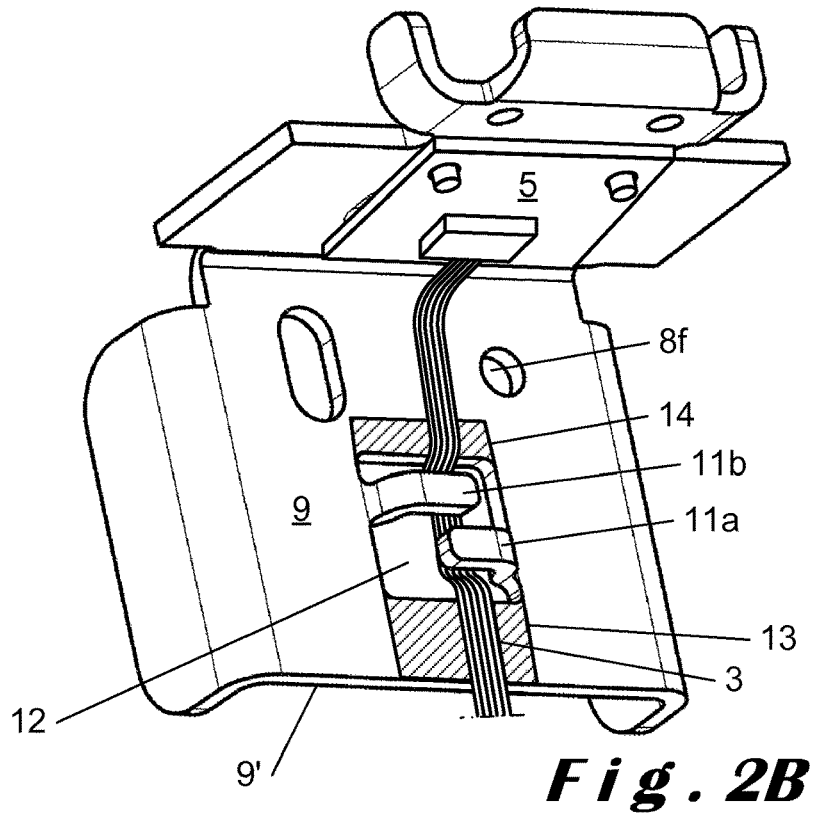

A second alternative embodiment of the method according to the invention is shown in FIGS. 2A and 2B.

The second and fourth steps 2b, 2e of this second embodiment are the same as in the first embodiment.

On the other hand, this second embodiment differs from the first embodiment in that the second step 2b involves moving the group 3 between a first lug 11a and a second lug 11b and a surface S of the heat sink 2 defined on the first face 9 of the heat sink 2. As a result, the group 3 is held between the lugs 11a, 11b and the surface of the heat sink 2, each of the lugs 11a, 11b projecting from the surface S. In a variant embodiment, only one lug is formed from the heat sink 2 to hold the group 3, and it may be folded as required following positioning of the group in order to prevent any relative movement of the electrical group.

Potentially, the second portion $P_2$ of the heat sink 2 has a fourth orifice 12, each of the lugs 11a, 11b projecting from the edge of the fourth orifice 12 beneath the lugs 11a, 11b linking the first face 9 to the second face 9'.

The presence of this fourth orifice 12 facilitates the placement of high-diameter groups 3 since, when placing this type of group 3 between the heat sink 2 and each of the lugs 11a, 11b, a portion of the group 3, the diameter of which is for example greater than the distance L between the lugs 11a, 11b and a horizontal plane passing through the surface S, may be seated in the orifice 12 and the group 3 is clamped between firstly the two lugs 11a, 11b and secondly a first portion 13 and a second portion 14 of the surface S on either side of the orifice 12.

In this context, the second embodiment of the assembly method is less costly and quicker than the first embodiment for this method. Indeed, since the group 3 is directly linked to the heat sink 2 by the lugs 11a, 11b projecting from the surface S of the heat sink 2, there is no need to use a specific part on the electrical group of the cooling rib.

The device obtained in the second embodiment of the method according to the invention therefore differs from the first device from the first embodiment of the assembly method in that the holding means 8 are first and second lugs 11a, 11b projecting from the surface S (FIG. 2A) of the heat sink 2, the group 3 of electrical wires being held between the first and second lugs 11a, 11b and the surface S.

Although the description relates to a preferred embodiment of the method according to the invention and of the device obtained from such a method in which the semiconductor component is a light-emitting diode 1, the heat sink 2 is a lamp cooling rib and the electrical connection element is the PCB 5, it is understood that the present invention is not limited to these features, but that it also covers other embodiments involving other semiconductor components, other heat sinks for the semiconductor component, and other electrical connection elements.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A device including at least one semiconductor component connected to an electrical connection element, so that the at least one semiconductor component is in contact with a first surface of the electrical connection element, the first surface of the electrical connection element is in contact with a heat sink and connected to a group of electrical wires, the first surface of the electrical connection element radiating heat to the heat sink, the group being linked mechanically and electrically to the electrical connection element by a single connector in contact with a second surface of the electrical connection element opposite to the first surface,
wherein the group is linked to the heat sink by a holder, and
wherein the holder comprises at least a first lug projecting from a side surface of an orifice of the heat sink, the group of electrical wires being held between the first lug and an edge of the orifice.

2. The device according to claim 1, wherein the at least one semiconductor component comprises at least one semiconductive emitter chip.

3. The device according to claim 2, wherein the electrical connection element is a printed circuit board.

4. The device according to claim 2, wherein the heat sink is substantially L-shaped.

5. The device according to claim 2, wherein the heat sink has openings.

6. The device according to claim 1, wherein the heat sink is linked to a supporting element in a motor vehicle lamp or inside a vehicle rear-light supporting element.

7. The device according to claim 6, wherein the electrical connection element is a printed circuit board.

8. The device according to claim 6, wherein the heat sink has openings.

9. The device according to claim 1, wherein the electrical connection element is a printed circuit board.

10. The device according to claim 1, wherein the heat sink is substantially L-shaped.

11. The device according to claim 10, wherein the holder is on one of the branches of the L-shape of the heat sink.

12. The device according to claim 1, wherein the heat sink has openings.

13. A lighting device for a motor vehicle, wherein the lighting device for a motor vehicle includes the device according to claim 1.

14. A device including at least one semiconductor component connected to an electrical connection element so that the at least one semiconductor component is in contact with a first surface of the electrical connection element, the first surface of electrical connection element is attached to a heat sink and connected to a group of electrical wires, said group being linked mechanically and electrically to said electrical connection element by a single connector in contact with a second surface of the electrical connection element opposite to the first surface, wherein said group is linked to said heat sink by a holder,
wherein said group is linked mechanically to said heat sink by said a holder comprising a first portion formed by a clamping ring through which said group passes and a second portion formed by a click-fit foot made of a thermally insulating material attaching said clamping ring to said heat sink,
wherein the click-fit foot is inserted in an orifice of the heat sink, and
wherein the click-fit foot is thermally decoupled from the heat sink.

15. The device according to claim 14, wherein the click-fit foot includes a click-fit branch comprising two fins that bear against a front side of the heat sink.

16. The device according to claim 14, wherein the click-fit foot includes a click-fit branch comprising two elbows protruding from the click-fit branch in mutually opposing directions forming a click-fit arrow, wherein the click-fit arrow is inserted in the orifice of the heat sink.

17. The device according to claim 14, wherein
the click fit foot includes a click-fit branch comprising
two fins that bear against a front side of the heat sink around the orifice, and
two elbows protruding from the click-fit branch in mutually opposing directions forming a click-fit arrow,
wherein the click-fit arrow is inserted in the orifice of the heat sink, and
wherein the two elbows bear against a back side of the heat sink around the orifice.

18. A method for assembling a semiconductor component on a heat sink, the semiconductor component being connected to an electrical connection element, so that the semiconductor component is in contact with a first surface of the electrical connection element, wherein the method comprises:

a first step in which a group of electrical wires is attached and connected to the electrical connection element using a single connector in contact with a second surface of the electrical connection element opposite to the first surface, a second step in which the group is attached to the heat sink using a holder, and a third step in which the electrical connection element is attached to the heat sink;

wherein the holder comprises at least a first lug projecting from a side surface of an orifice of the heat sink, the group of electrical wires being held between the first lug and an edge of the orifice, and the first surface of the electrical connection element is in contact with the heat sink and connected to the group of electrical wires, the first surface of the electrical connection element radiating heat to the heat sink.

\* \* \* \* \*